(12) United States Patent
Kim

(10) Patent No.: US 9,240,475 B2
(45) Date of Patent: Jan. 19, 2016

(54) SEMICONDUCTOR DEVICE

(71) Applicant: Samsung Electronics Co., Ltd., Suwon-si, Gyeonggi-Do (KR)

(72) Inventor: Yong-Don Kim, Hwaseong-si (KR)

(73) Assignee: SAMSUNG ELECTRONICS CO., LTD., Gyeonggi-Do (KR)

( * ) Notice: Subject to any disclaimer, the term of this patent is extended or adjusted under 35 U.S.C. 154(b) by 0 days.

(21) Appl. No.: 13/944,001

(22) Filed: Jul. 17, 2013

(65) Prior Publication Data
US 2014/0117424 A1 May 1, 2014

(30) Foreign Application Priority Data

Oct. 30, 2012 (KR) .................. 10-2012-0121472

(51) Int. Cl.
| | |
|---|---|
| *H01L 23/48* | (2006.01) |
| *H01L 29/78* | (2006.01) |
| *H01L 23/482* | (2006.01) |
| *H01L 23/528* | (2006.01) |

(52) U.S. Cl.
CPC ............ *H01L 29/78* (2013.01); *H01L 23/4824* (2013.01); *H01L 23/528* (2013.01); *H01L 2924/0002* (2013.01)

(58) Field of Classification Search
CPC .................. H01L 23/481; H01L 2924/00013; H01L 2224/131
USPC ........................... 257/288, 774, 314, 529, 665
See application file for complete search history.

(56) References Cited

U.S. PATENT DOCUMENTS

| | | | |
|---|---|---|---|
| 6,459,125 B2 | 10/2002 | Maeda et al. | |
| 6,780,748 B2 | 8/2004 | Yamaguchi et al. | |
| 6,939,789 B2 | 9/2005 | Huang et al. | |
| 6,949,416 B2 | 9/2005 | Miyamoto et al. | |
| 7,471,500 B1 * | 12/2008 | Chen et al. | ................. 361/306.1 |
| 7,705,457 B2 | 4/2010 | Han | |
| 7,709,954 B2 | 5/2010 | Loo | |
| 7,851,856 B2 | 12/2010 | Hebert | |
| 7,977,783 B1 | 7/2011 | Park et al. | |
| 8,035,226 B1 | 10/2011 | Wilcoxen et al. | |
| 8,134,238 B2 | 3/2012 | Komiya | |
| 2003/0218246 A1 | 11/2003 | Abe et al. | |
| 2006/0038291 A1 | 2/2006 | Chung et al. | |
| 2007/0145558 A1 | 6/2007 | Chia et al. | |
| 2009/0141424 A1 * | 6/2009 | Barth et al. | .................... 361/311 |

(Continued)

*Primary Examiner* — Chuong A Luu
*Assistant Examiner* — Rodolfo Fortich
(74) *Attorney, Agent, or Firm* — Harness, Dickey & Pierce, P.L.C.

(57) ABSTRACT

A semiconductor device is provided that includes a substrate including a device region and a peripheral region surrounding the device region, a first interconnection including one or more first conductive lines extending in a first direction, a second interconnection including one or more second conductive lines extending in the first direction, the second interconnection spaced apart from the first interconnection, a first conductive plate and a second conductive plate spaced apart from each other, the first conductive plate corresponding to the first interconnection and the second conductive plate corresponding to the second interconnection, one or more first vias connecting the first conductive lines to the first conductive plate and overlapping the device region and one or more second vias connecting the second conductive lines to the second conductive plate, the second vias overlapping the device region and arranged in a staggered, alternating configuration with the one or more first vias.

6 Claims, 13 Drawing Sheets

(56) References Cited

U.S. PATENT DOCUMENTS

| | | |
|---|---|---|
| 2010/0193950 A1 | 8/2010 | Lee et al. |
| 2011/0204511 A1 | 8/2011 | Beddingfield et al. |
| 2011/0300668 A1 | 12/2011 | Parvarandeh |
| 2011/0315986 A1 | 12/2011 | Kaneda et al. |
| 2012/0104605 A1 | 5/2012 | Ilzer et al. |
| 2012/0282753 A1* | 11/2012 | Kim .............................. 438/396 |

* cited by examiner

SEMICONDUCTOR DEVICE

CROSS-REFERENCE TO RELATED APPLICATION

This application claims priority from Korean Patent Application No. 10-2012-0121472 filed on Oct. 30, 2012 in the Korean Intellectual Property Office, and all the benefits accruing therefrom under 35 U.S.C. 119, the contents of which in its entirety are herein incorporated by reference.

BACKGROUND

1. Field of the Invention

The present invention relates to a semiconductor device.

2. Description of the Related Art

Recently, as electronic devices such as smart phones are becoming light, thin, short and small, they include many built-in functions, thus achieving high specification electronic devices. Since the high specification electronic device needs to be capable of quickly processing functions, switching speeds of the electronic device are increasing. The increasing switching speeds of the electronic device may increase current driving capability, resulting in a reduction of the useful time of a battery with a limited capacity. In order to increase the useful time of the battery, various studies for reducing power consumption of semiconductor devices are being conducted.

SUMMARY

The present invention provides a semiconductor device, which can reduce resistance due to a routing path and can suppress heat generation due to use of high power, by connecting a redistribution to a source and a drain of a power integrated circuit (IC).

The above and other objects of the present invention will be described in or be apparent from the following description of the some example embodiments.

According to an aspect of the present invention, there is provided a semiconductor device including a substrate including a device region and a peripheral region surrounding the device region, a first interconnection including one or more first conductive lines extending in a first direction on the substrate, a second interconnection including one or more second conductive lines extending in the first direction on the substrate, the second interconnection spaced apart from the first interconnection, a first conductive plate and a second conductive plate spaced apart from each other, the first conductive plate corresponding to the first interconnection and the second conductive plate corresponding to the second interconnection, one or more first vias connecting the first conductive lines to the first conductive plate and overlapping the device region, and one or more second vias connecting the second conductive lines to the second conductive plate, the second vias overlapping the device region and arranged in a staggered, alternating configuration with the one or more first vias.

According to another aspect of the present invention, there is provided a semiconductor device including a substrate including a device region and a peripheral region, gate line on the device region extending in one direction, source and a drain formed at both sides of the gate line, first contact and a second contact formed in contact with the source and the drain, respectively, and extending along the gate line, a first interconnection electrically connected to the first contact, the first interconnection aligned with the first contact and directly above the device region, a second interconnection electrically connected to the second contact, the second interconnection aligned with the second contact and directly above the device region, a first conductive plate overlapping a portion of the first interconnection and a portion of the second interconnection, second conductive plate overlapping a portion of the first interconnection and a portion of the second interconnection, first vias connecting the first interconnection to the first conductive plate, and second vias connecting the second interconnection to the second conductive plate.

According to another aspect of the present invention, there is provided a semiconductor device including a substrate including a device region and a peripheral region; a first conductive structure on the substrate, the first conductive structure including a first interconnection and a plurality of first conductive lines extending from the first interconnection in a first direction; a second conductive structure facing the first conductive structure on the substrate, the second conductive structure including a second interconnection and a plurality of second conductive lines extending from the second interconnection in the first direction such that the plurality of second conductive lines and the plurality of first conductive lines interdigitate; a first conductive plate connected to the plurality of first conductive lines; and a second conductive plate spaced apart from the first conductive plate and connected to the plurality of second conductive lines.

BRIEF DESCRIPTION OF THE DRAWINGS

The above and other features and advantages of the present invention will become more apparent by describing in detail some example embodiments thereof with reference to the attached drawings in which.

DETAILED DESCRIPTION OF EXAMPLE EMBODIMENTS

Figure 1:
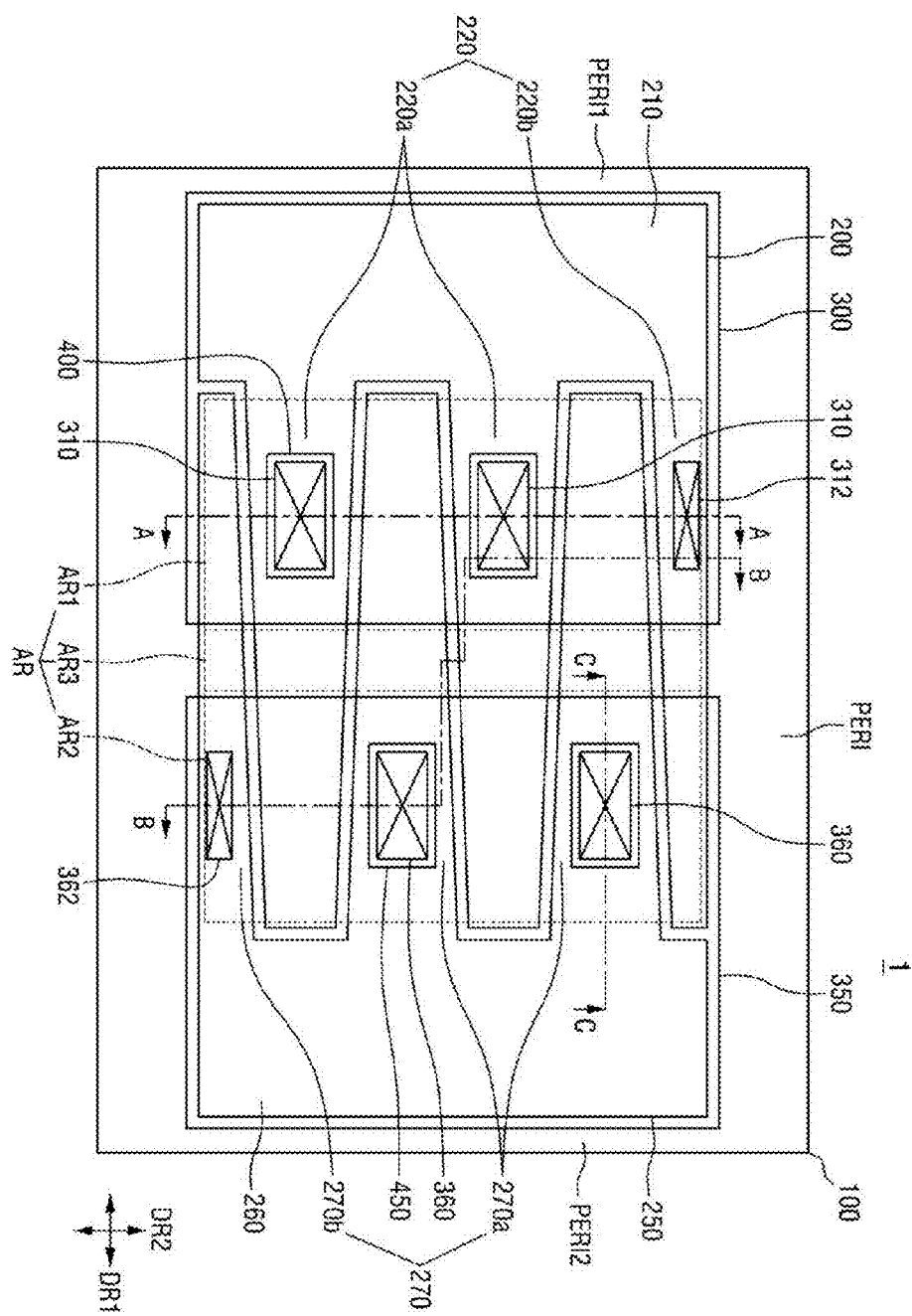
FIG. 1 is a plan view of a semiconductor device according to a first example embodiment of the present invention.

The present invention will now be described more frilly hereinafter with reference to the accompanying drawings, in which some example embodiments of the invention are shown. This invention may, however, be embodied in different forms and should not be construed as limited to the example embodiments set forth herein. Rather, these example embodiments are provided so that this disclosure will be thorough and complete, and will fully convey the scope of the invention to those skilled in the art. The same reference numbers indicate the same components throughout the specification. In the attached figures, the thickness of layers and regions is exaggerated for clarity.

It will be understood that when an element or layer is referred to as being "connected to," or "coupled to" another element or layer, it can be directly connected to or coupled to another element or layer or intervening elements or layers may be present. In contrast, when an element is referred to as being "directly connected to" or "directly coupled to" another element or layer, there are no intervening elements or layers present. Like numbers refer to like elements throughout. As used herein, the term "and/or" includes any and all combinations of one or more of the associated listed items.

It will also be understood that when a layer is referred to as being "on" another layer or substrate, it can be directly on the other layer or substrate, or intervening layers may also be present. In contrast, when an element is referred to as being "directly on" another element, there are no intervening elements present.

It will be understood that, although the terms first, second, etc. may be used herein to describe various elements, these elements should not be limited by these terms. These terms are only used to distinguish one element from another element. Thus, for example, a first element, a first component or a first section discussed below could be termed a second element, a second component or a second section without departing from the teachings of the present invention.

The use of the terms "a" and "an" and "the" and similar referents in the context of describing the invention (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Unless defined otherwise, all technical and scientific terms used herein have the same meaning as commonly understood by one of ordinary skill in the art to which this invention belongs. It is noted that the use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Figure 2:
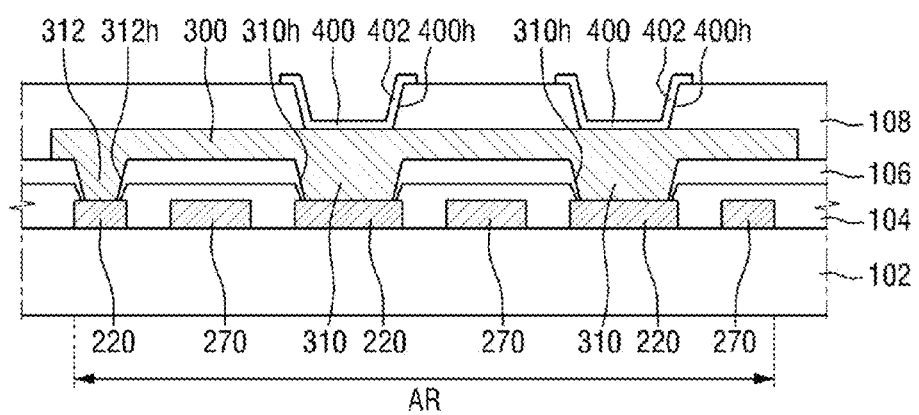
FIG. 2 is a cross-sectional view taken along the line AA of FIG. 1.
Figure 3:
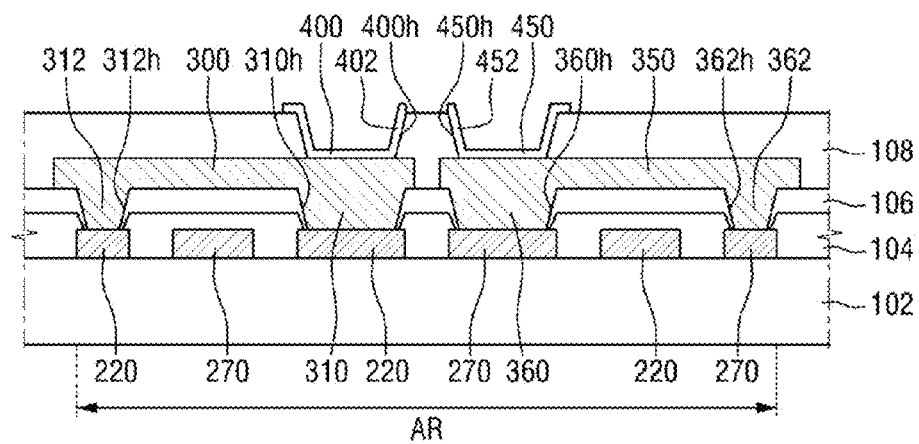
FIG. 3 is a cross-sectional view taken along the line BB of FIG. 1.
Figure 4:
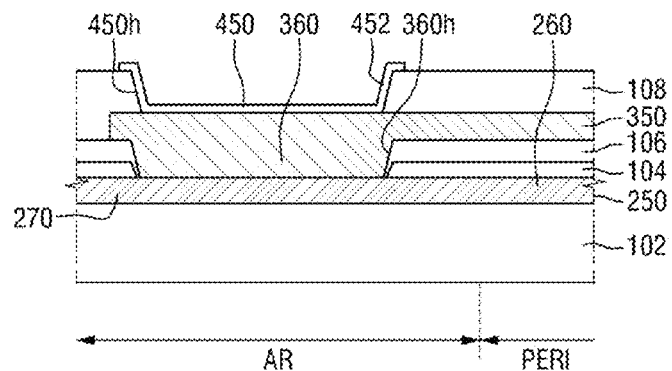
FIG. 4 is a cross-sectional view taken along the line CC of FIG. 1.
Figure 5:
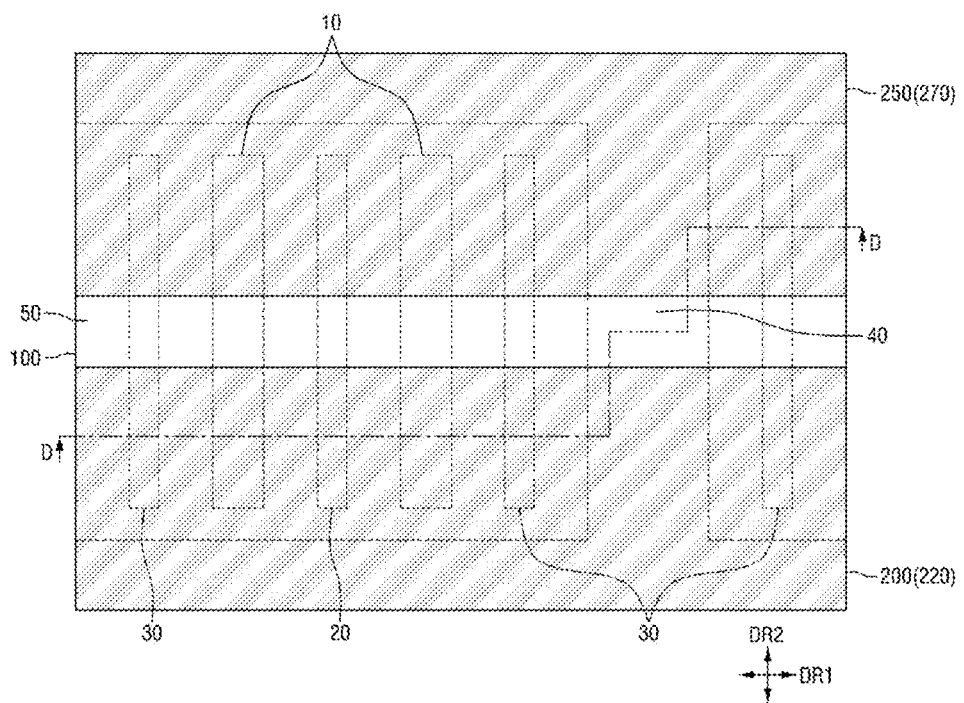
FIG. 5 is a plan view illustrating portions of a first interconnection and a second interconnection shown in FIG. 1.
Figure 6:
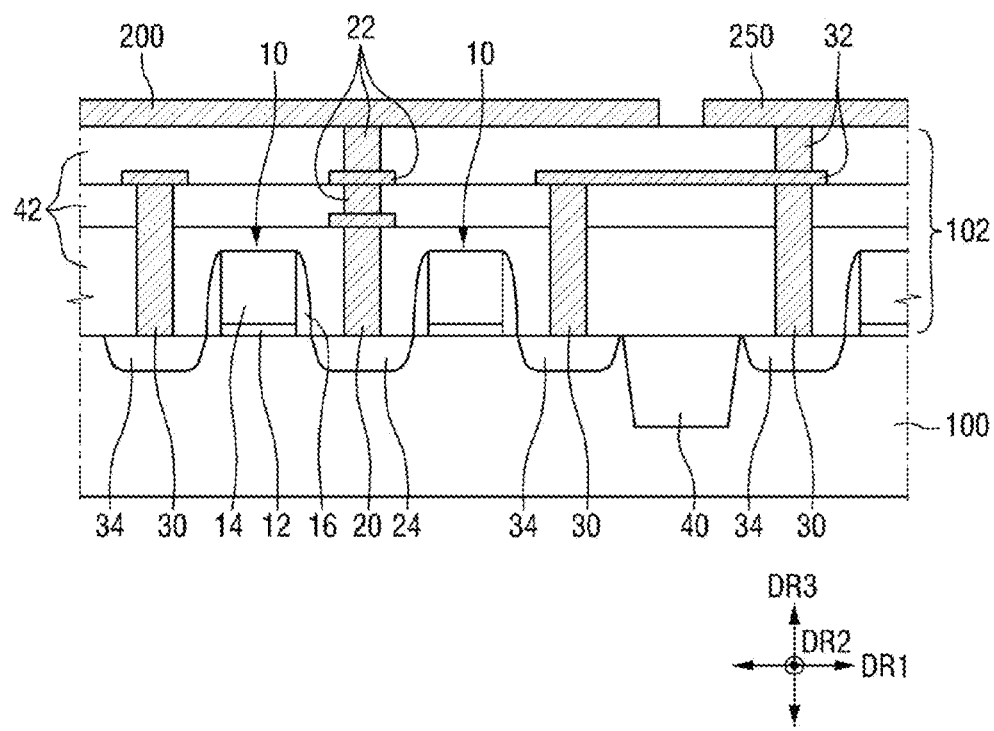
FIG. 6 is a cross-sectional view taken along the line DD of FIG. 5.
Figure 7:
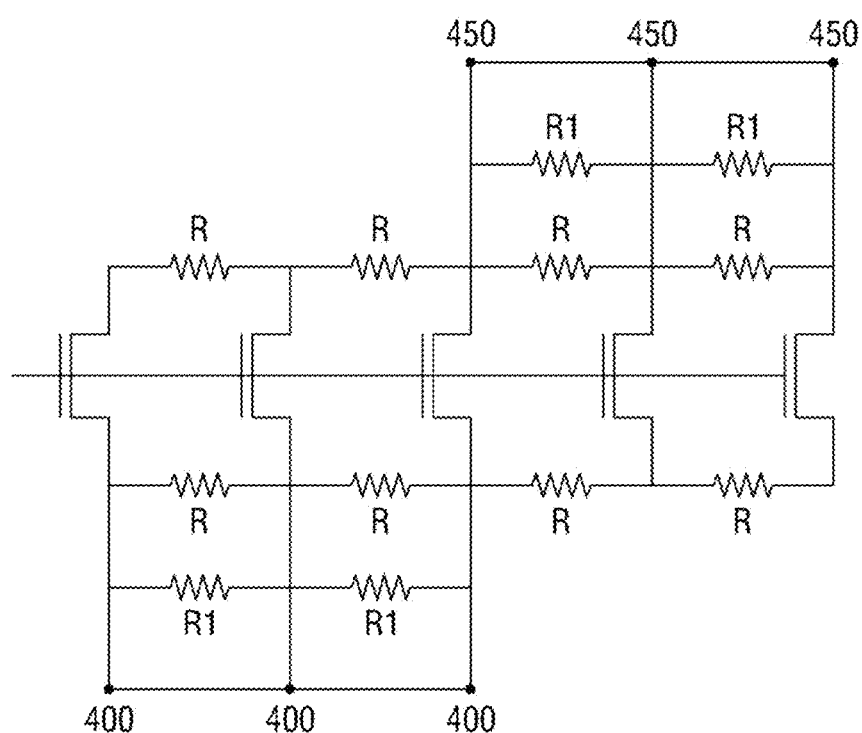
FIG. 7 is a schematic equivalent circuit view of the semiconductor device shown in FIG. 1.

Hereinafter, a semiconductor device according to a first example embodiment of the present invention will be described with reference to FIGS. 1 to 7. FIG. 1 is a plan view of a semiconductor device according to the first example embodiment of the present invention, FIG. 2 is a cross-sectional view taken along the line AA of FIG. 1, FIG. 3 is a cross-sectional view taken along the line BB of FIG. 1, FIG. 4 is a cross-sectional view taken along the line CC of FIG. 1, FIG. 5 is a plan view illustrating portions of a first interconnection and a second interconnection shown in FIG. 1, FIG. 6 is a cross-sectional view taken along the line DD of FIG. 5, and FIG. 7 is a schematic equivalent circuit view of the semiconductor device shown in FIG. 1.

First, referring to FIG. 1, the semiconductor device 1 may include a substrate 100, a first interconnection 200, a second interconnection 250, a first conductive plate 300, a second conductive plate 350, first vias 310 and 312 and second vias 360 and 362. The semiconductor device 1 may further include first pads 400 and second pads 450.

The substrate 100 may include a device region AR and a peripheral region PERI. The device region AR may be surrounded by the peripheral region PERI. The device region AR may include a first region AR1, a second region AR2 and a third region AR3. The third region AR3 may be defined between the first region AR1 and the second region AR2. The peripheral region PERI may include a first peripheral portion PERI 1 and a second peripheral portion PERI 2. The first peripheral portion PERI 1 is a portion of the peripheral region PERI contacting the first region AR1, and the second peripheral portion PERI 2 is a portion of the peripheral region PERI contacting the second region AR2. In FIG. 1, the third device region AR3 is shaped like a rectangle extending lengthwise in a second direction DR2. However, this is provided only for illustrating a particular example embodiment of the semiconductor device of the present invention and example embodiments of the present invention are not limited thereto. For example, the third device region AR3 may be shaped like a regular quadrilateral or a rectangle extending in the first direction DR1.

The device region AR may include an isolation region and an active region. Circuit patterns may be formed on the active region in the device region AR. The circuit patterns formed in the active region may include a plurality of gate patterns extending lengthwise in, for example, one direction. The circuit patterns formed in the device region AR will later be described in detail with reference to FIGS. 5 and 6.

The substrate 100 may be a bulk silicon or a silicon-on-insulator (SOI). Alternatively, the substrate 100 may be a silicon substrate or a substrate made of another material, for example, a silicon germanium, antimony indium, a lead telluride compound, indium arsenic, indium phosphide, gallium arsenic, and antimony gallium, but not limited thereto.

The first interconnection 200 and the second interconnection 250 may be formed on the substrate 100. The first interconnection 200 and the second interconnection 250 are spaced apart from each other. The first interconnection 200 may include a first connection line 210 and one or more first conductive lines 220. The second interconnection 250 include a second connection line 260 and one or more second conductive lines 270. The first conductive lines 220 and the second conductive lines 270 are formed to extend in the first direction DR1. The first conductive lines 220 and the second conductive lines 270 may be alternately formed in a second direction DR2. That is, the first conductive lines 220 and the second conductive lines 270 may interdigitate. The first connection line 210 is connected to the one or more first conductive lines 220, and the second connection line 260 is connected to the one or more second conductive lines 270. The first connection line 210 and the second connection line 260 may be formed to face each other with the device region AR disposed therebetween.

The first conductive lines 220 and the second conductive lines 270 are formed directly above the device region AR and may overlap the device region AR. The first connection line 210 and the second connection line 260 may be formed on the peripheral region PERI and may not overlap the device region AR. In the description of the example embodiments of the present invention, the first connection line 210 and the second connection line 260 do not overlap the device region AR, but example embodiments of the present invention are not limited thereto. For example, portions of the first connection line 210 and the second connection line 260 may overlap the device region AR.

The first interconnection 200 and the second interconnection 250 may be configured such that the first conductive lines 220 and the second conductive lines 270 spaced a desired distance apart from each other are engaged with each other. For example, the first conductive lines 220 and the second conductive lines 270 may interdigitate. The first conductive lines 220 and the second conductive lines 270 may have, for example, a saw tooth shape, but example embodiments of the present invention are not limited thereto. For example, the first conductive lines 220 and the second conductive lines 270 may have rectangular or square saw tooth shapes. The first conductive lines 220 and the second conductive lines 270 may be shaped like trapezoids having widths decreasing away from the first connection line 210 and the second connection line 260.

The first conductive lines 220 may include a first conductive line 220a having a first width and a first conductive line 220b having a second width. In view of connecting parts of the first conductive lines 220 and the first connection line 210, the second width of the first conductive line 220b may be smaller than the first width of the first conductive line 220a. The second conductive lines 270 may include a second conductive line 270b having a first width and a second conductive line 270b having a second width. In view of connecting parts of the first conductive lines 270 and the second connection line 260, the second width of the second conductive line 270b may be smaller than the first width of the second conductive line 270a. The first conductive line 220b having the relatively small second width and the second conductive line 270b having the relatively small second width may be outermost conductive lines among the plurality of first and second conductive lines 220 and 270.

The first interconnection 200 and the second interconnection 250 may include circuit patterns formed on the device region AR, for example, metal interconnections of transistors connected to the source and the drain, respectively. The first interconnection 200 and the second interconnection 250 may include, for example, a metal such as aluminum (Al).

A first conductive plate 300 and a second conductive plate 350 are formed on the first interconnection 200 and the second interconnection 250. The first conductive plate 300 and the second conductive plate 350 may be spaced apart from each other. The first conductive plate 300 and the second conductive plate 350 may have a rectangular plate shape, for example, a regular quadrilateral shape or a rectangular plate shape. The first conductive plate 300 and the second conductive plate 350 may include first pads 400 and second pads 450 which may be connected to external terminals. The first pads 400 and the second pads 450 will later be described.

The first conductive plate 300 and the second conductive plate 350 may be formed over the device region AR and the peripheral region PERI. For example, the first conductive plate 300 and the second conductive plate 350 may entirely overlap the corresponding device region AR and the peripheral region PERI. As an example, the first conductive plate 300 may overlap a first region AR1 of the device region AR and a first peripheral portion PERI 1, and the second conductive plate 350 may overlap a second region AR2 of the device region AR and a second peripheral portion PERI 2.

In the device region AR, the first region AR1 and the second region AR2 may be defined according to which of first conductive plate 300 and the second conductive plate 350 they overlap. A third region AR3 of the device region AR may be a region of the device region AR not overlapping the first conductive plate 300 and the second conductive plate 350.

The first conductive plate 300 may overlap the first conductive lines 220 formed on the first region AR1 and the second conductive lines 270 formed on the first region AR1 and may overlap the first connection line 210. For example, the first conductive plate 300 may overlap portions of the first conductive lines 220 and portions of the second conductive lines 270. The second conductive plate 350 may overlap the first conductive lines 220 formed on the second region AR2 and the second conductive lines 270 formed on the second region AR2, and may overlap the second connection line 260. The second conductive plate 350 may also overlap portions of the first conductive lines 220 and portions of the second conductive lines 270. Therefore, the first conductive lines 220 and the second conductive lines 270 formed on the third region AR3 do not overlap the first conductive plate 300 and the second conductive plate 350.

The first conductive plate 300 and the second conductive plate 350 may include metals having high electric conductivity and good heat dissipation capability. For example, the first conductive plate 300 and the second conductive plate 350 may include copper (Cu).

The first conductive plate 300 and the second conductive plate 350 may be formed on the first interconnection 200 and the second interconnection 250 and may reduce electrical resistance between circuit patterns formed on the substrate 100 and the first and second interconnections 200 and 250. In addition, the first conductive plate 300 and the second conductive plate 350 may be formed on the first interconnection 200 and the second interconnection 250 and may be used as heat sink members for efficiently emitting the heat generated from the first interconnection 200 and the second interconnection 250 and lower portions of the first conductive plate 300 and the second conductive plate 350.

Referring to FIG. 1, the semiconductor device 1 may include one or more first vias 310 and 312 and one or more second vias 360 and 362. The first vias 310 and 312 and the second vias 360 and 362 may be connected to the first interconnection 200 and the second interconnection 250, respectively. The first vias 310 and 312 formed on the first conductive lines 220 may connect the first conductive lines 220 and the first conductive plate 300. The second vias 360 and 362 formed on the second conductive lines 270 may connect the second conductive lines 270 and the second conductive plate 350. The first vias 310 and 312 may include one or more first vias formed on the first conductive lines 220, and the second vias 360 and 362 may include one or more second vias formed on the second conductive lines 270.

In the description of the semiconductor device 1 according to the first example embodiment of the present invention, each of the first vias 310 and 312 is formed on each of the first conductive lines 220, and each of the second vias 360 and 362 is formed on each of the second conductive lines 270.

The first vias 310 and 312 are formed on the device region AR. Specifically, the first vias 310 and 312 overlap the first region AR1. The second vias 360 and 362 are formed on the device region AR. Specifically, the second vias 360 and 362 overlap the second region AR2. For example, the first vias 310 and 312 and the second vias 360 and 362 may entirely overlap the device region AR. Specifically, the first vias 310 and 312 may entirely overlap the first region AR1, and the second vias 360 and 362 may entirely overlap the second region AR2. In FIG. 1, the first vias 310 and 312 and the second vias 360 and 362 entirely overlap the device region AR, but example embodiments of the present invention are not limited thereto.

The first vias 310 and 312 formed on the first conductive lines 220 may be aligned in a second direction DR2, and the second vias 360 and 362 formed on the second conductive lines 270 may be aligned in the second direction DR2. The first vias 310 and 312 and the second vias 360 and 362 may be staggered or arranged in a zig-zag configuration directly above the device region AR.

Sizes of the first vias 310 and 312 formed on the first conductive lines 220 may be different from each other. For example, a first via 312 having a first width formed on the first conductive line 220a and a first via 310 having a second width formed on the first conductive line 220b may have different sizes. If a lower width of the first conductive line 220 increases, the sizes of the upper first vias 310 and 312 may also increase, but example embodiments of the present invention are not limited thereto.

The first vias 310 and 312 and the second vias 360 and 362 may include, for example, the same metal as that of the first conductive plate 300 and the second conductive plate 350, specifically, copper (Cu).

Referring to FIG. 1, the first conductive plate 300 may include one or more first pads 400, and the second conductive plate 350 may include one or more second pads 450. The first pads 400 and the second pads 450 may overlap the device region AR, respectively. For example, the first pads 400 and the second pads 450 may entirely overlap the device region AR, respectively. Specifically, the first pads 400 may entirely overlap the first region AR1 of the device region AR, and the second pads 450 may entirely overlap the second region AR2 of the device region AR.

The first pads 400 may be formed to overlap one or more first conductive lines 220, and the second pads 450 may be formed to overlap one or more second conductive lines 270. In addition, the one or more first vias 310 and 312 may overlap the first pads 400, and the one or more second vias 360 and 362 may overlap the second pads 450. When viewed on a plan view, the first pads 400 and first vias 310 and 312 may be formed to overlap each other, and the second pads 450 and the second vias 360 and 362 may be formed to overlap each other.

In FIG. 1, the first pads 400 are formed to overlap only the first conductive line 220a having the first width, and the second pads 450 are formed to overlap only the second conductive line 270a having the first width, but example embodiments of the present invention are not limited thereto. For example, the first pads 400 and the second pads 450 may also be formed on the first conductive line 220b having the second width and the second conductive line 270b having the second width.

In the following description of the semiconductor device 1 according to the first example embodiment of the present invention, it is assumed that the first pads 400 completely overlap the first vias 310 and 312 and the second pads 450 completely overlap the second vias 360 and 362, but example embodiments of the present invention are not limited thereto. For example, the first pads 400 and the second pads 450 may be smaller than the first vias 310 and 312 and the second vias 360 and 362, respectively, in size. Therefore, the first vias 310 and 312 may be formed to completely overlap the first pads 400, and the second vias 360 and 362 may be formed to completely overlap the second pads 450.

In the following description of the semiconductor device 1 according to the first example embodiment of the present invention, it is assumed that the first pads 400 entirely overlap one of the first conductive lines 220 and one of the first vias 310 but example embodiments of the present invention are not limited thereto. For example, the first pads 400 may be formed to overlap not only the lower first conductive line 220 but also the adjacent second conductive line 270. In addition, the first pads 400 may be formed to commonly overlap the first vias 310 and 312 formed to be adjacent to each other. Here, the center of the first pads 400 may be formed on the second conductive line 270 positioned between the first vias 310 and 312. The first pads 400 may be formed to overlap the second conductive line 270 because an insulating material (104 and 106 of FIG. 2) is interposed between the first conductive plate 300 and the second conductive line 270.

Referring to FIGS. 1 and 2, a circuit pattern region 102 is formed on the substrate 100. The circuit pattern region 102 may include, for example, circuit patterns, such as transistors or diodes, and interconnections electrically connecting the first interconnection 200 and the second interconnection 250.

The first interconnection 200 and the second interconnection 250 may be alternately formed on the circuit pattern region 102. For example, the first conductive lines 220 and the second conductive lines 270 may be alternately formed on the circuit pattern region 102, and may be formed at the same height from the substrate 100. The first conductive lines 220 and the second conductive lines 270 may be formed in the device region AR.

A passivation film 104 and a first passivation film 106 may be sequentially stacked on the circuit pattern region 102. In the first region AR1 illustrated in FIG. 2, the passivation film 104 and the first passivation film 106 may cover the second conductive lines 270. In the first region AR1 illustrated in FIG. 2, the passivation film 104 and the first passivation film 106 may include openings exposing the first conductive lines 220. The first passivation film 106 may include first via holes 310h and 312h exposing the first conductive lines 220. The openings exposing the first conductive lines 220 in the passivation film 104 may be formed to overlap the first via holes 310h and 312h in the first passivation film 106. The first via holes 310h and 312h are formed in the device region AR. The passivation film 104 and first passivation film 106 include insulating materials. For example, the passivation film 104 may include a nitride film or an oxide film, and the first passivation film 106 may include photosensitive polyimide (PSPI).

The first via holes 310h and 312h may be filled to form the first vias 310 and 312. A first conductive plate 300 may be formed on the first vias 310 and 312 and the first passivation film 106. The first vias 310 and 312 and the first conductive plate 300 may include, for example, the same conductive material, specifically copper (Cu). The first vias 310 and 312 and the first conductive plate 300 may directly contact each other. For example, the first vias 310 and 312 and the first conductive plate 300 may be formed at the same level. Here, when an element or layer is referred to as being at "the same level" as another element or layer, it can be formed by the same fabricating process as the other element or layer. For example, the first vias 310 and 312 and the first conductive plate 300 may be simultaneously formed by the same metallization process.

A width of the first conductive plate 300 may be greater than a width of the device region AR. In FIG. 2, one surface of the first conductive plate 300 contacting a first adhesive film 402 is substantially planar, which is, however, provided only for illustration of the example embodiment of the present invention and example embodiments of the present invention are not limited thereto. For example, the first conductive plate 300 and first vias 310 and 312 may be conformally formed to have a desired thickness along the first passivation film 106 and the first conductive lines 220.

A second passivation film 108 may be formed on the first conductive plate 300 and may cover the first conductive plate 300. The second passivation film 108 may include first openings 400h exposing the first pads 400. The first pads 400 may be portions of the first conductive plate 300 exposed by the first openings 400h. The first openings 400h may be formed by one or more first vias 310 and 312 that are vertically aligned, but example embodiments of the present invention are not limited thereto. As described above, in FIG. 2, the first openings 400h are aligned above the center of the second conductive lines 270, thereby forming the first pads 400. The second passivation film 108 may include, for example, photosensitive polyimide (PSPI).

The first pads 400 are electrically connected in series to the lower first vias 310 formed on the device region AR.

The first adhesive film 402 may be formed on the first pads 400. The first adhesive film 402 may be conformally formed along the first openings 400h. The first adhesive film 402 may be an under bump metallurgy (UBM) layer serving as a diffusion preventing layer or a wetting layer. The first adhesive film 402 may have a multi-layered structure formed by depositing various metals, including, chrome (Cr), copper (Cu), nickel (Ni), titanium-tungsten (TiW), nickel-vanadium (NiV), and so on, by sputtering. For example, a junction metal film may have a structure, including, for example, Cr/Cr—Cu/Cu, TiW/Cu, Al/NiV/Cu, Ti/Cu, Ni/Au or Ti/Cu/Ni.

Referring to FIGS. 1 and 3, the passivation film 104 may include openings exposing portions of the first conductive lines 220 and the second conductive lines 270. The first passivation film 106 may include first via holes 310h and 312h exposing portions of the first conductive lines 220 and second via holes 360h and 362h exposing portions of the second conductive lines 270. The first via holes 310h and 312h and the second via holes 360h and 362h are formed on the device region AR. For example, in the first region AR1, the passivation film 104 and the first passivation film 106 may cover the second conductive lines 270 and the passivation film 104 and the first passivation film 106 may include openings exposing the first conductive lines 220. In the second region AR2, the passivation film 104 and the first passivation film 106 may cover the first conductive lines 220 and the passivation film 104 and the first passivation film 106 may include openings exposing the second conductive lines 270.

The first via holes 310h and 312h and the second via holes 360h and 362h may be filled to form the first vias 310 and 312 and the second vias 360 and 362, respectively. The first conductive plate 300 may be formed on the first vias 310 and 312 and the first passivation film 106, and the second conductive plate 350 may be formed on the second vias 360 and 362 and the first passivation film 106. The first vias 310 and 312 connect the first conductive lines 220 to the first conductive plate 300, and the second vias 360 and 362 connect the second conductive lines 270 to the second conductive plate 350.

The first conductive plate 300 and the second conductive plate 350 may include regions not overlapping the device region AR.

The first conductive plate 300, the first vias 310 and 312, the second conductive plate 350 and the second vias 360 and 362 may include, for example, the same conductive material, specifically copper (Cu). The first conductive plate 300, the first vias 310 and 312, the second conductive plate 350 and the second vias 360 and 362 may be formed at the same level.

Portions of the first conductive plate 300 and the second conductive plate 350 may be exposed, thereby forming the first pads 400 and the second pads 450. The first pads 400 and the second pads 450 may be formed to overlap one or more first vias 310 and 312 and one or more second vias 360 and 362. A first adhesive film 402 and a second adhesive film 452 may be formed on the first pads 400 and the second pads 450, respectively.

Referring to FIGS. 1 and 4, the second interconnection 250 is provided on the circuit pattern region 102. The second interconnection 250 may include a second conductive line 270 formed on the device region AR and a second connection line 260 formed on the peripheral region PERI. The second conductive plate 350 is formed on the second interconnection 250. A portion of the second conductive plate 350 does not overlap the device region AR and the second interconnection 250. The second vias 360 and 362 connecting the second interconnection 250 to the second conductive plate 350 are formed on the device region AR. The second pads 450 formed by the exposed portions of the second conductive plate 350 are formed to overlap the second vias 360 and 362 and are formed on the device region AR.

Referring to FIGS. 1 and 5, the device region AR includes a plurality of active regions 50 and isolation regions 40 formed between the active regions 50 on the substrate 100. Circuit patterns, such as transistors, may be formed on the active regions 50 having exposed top surfaces on the substrate 100. The isolation region 40 is formed to electrically insulate the active regions 50 from each other, and may have, for example, a shallow trench isolation (STI) structure, which is advantageous for high integration because of a good device isolating characteristic and a small occupying area.

A plurality of gate lines 10 and a source and a drain formed at both sides of the gate lines 10 may be formed on the active regions 50 in the device region AR. For example, a first contact 20 contacting the source, and a second contact 30 contacting the drain may be formed in the device region AR. The gate lines 10, the first contact 20 and the second contact 30, which are formed in the device region AR, may be formed to extend lengthwise, for example, in a second direction DR2. For example, the first contact 20 and the second contact 30 may be formed to extend along the gate lines 10 extending in the second direction DR2. When viewed on a plan view, the gate lines 10, the first contact 20 and the second contact 30 may be shaped like stripes extending in the second direction DR2.

The first contact 20 and the second contact 30 extend in the second direction DR2. The gate lines 10 extend in the second direction DR2 and each gate line 10 is between the first contact 20 and the second contact 30, thereby increasing the width of a transistor channel. As a result, a large amount of current may pass through lower portions of the gate lines 10 extending in the second direction DR2.

The first interconnection 200 and the second interconnection 250 may be formed on the gate lines 10, the first contact 20 and the second contact 30. The first interconnection 200 connected to the first contact 20 may be electrically connected to the source, and the second interconnection 250 connected to the second contact 30 may be electrically connected to the drain. For example, the first contact 20 connected to the first conductive lines 220 may serve as a medium for electrically connecting the first conductive lines 220 to the source, and the second contact 30 connected to the second conductive lines 270 may serve as a medium for electrically connecting the second conductive lines 270 to the drain.

In FIG. 5, the gate lines 10, the first contact 20 and the second contact 30 are formed to extend lengthwise in the second direction DR2, and the first conductive lines 220 and the second conductive lines 270 are formed to extend lengthwise in the first direction DR1. However, this is provided only for illustrating the semiconductor device of the present invention and example embodiments of the present invention are not limited thereto.

Referring to FIGS. 5 and 6, transistors and interconnections connected to the transistors are formed in the circuit pattern region 102 between the first interconnection 200 and the second interconnection 250 and the substrate 100. The gate lines 10 are formed on the active regions 50 in the device region AR. A source 24 and a drain 34 are formed on either side of the gate lines 10. The first contact 20 connected to the source 24 is formed on one side of the gate line 10, and the second contact 30 connected to the drain 34 is formed on the other side of the gate line 10. In the description of the example embodiment of the present invention, it is assumed that adjacent gate lines 10 share the source 24, but example embodiments of the present invention are not limited thereto. The first contact 20 is connected to the first interconnection 200 by means of a first internal interconnection 22, and the second contact 30 is connected to the second interconnection 250 by means of a second internal interconnection 32. For example, the second contacts 30 formed on different active regions 50 are connected through the second internal interconnection 32 and are then connected to the second interconnection 250.

The gate lines 10 may include a gate insulation film 12, a gate electrode 14 and a gate spacer 16. The gate insulation film 12 may include silicon oxide, SiON, $Ge_xO_yN_z$, $Ge_xSi_yO_z$, a high-k dielectric material, and combinations thereof, or a stacked structure of these materials sequentially stacked. The gate electrode 14 may include silicon (Si), specifically at least one of polycrystalline silicon (poly Si), amorphous silicon (a-Si), titanium (Ti), titanium nitride (TiN), tantalum nitride (TaN), aluminum (Al) and a combination thereof. The gate spacer 16 may include, for example, silicon nitride, silicon oxynitride, silicon oxide, or silicon oxycarbon nitride (SiOCN).

The first contact 20 and the second contact 30 formed on either side of the gate lines 10 may be formed in an interlayer dielectric film 42. The first contact 20 and the second contact 30 may have, for example, a plate shape. Specifically, the first contact 20 and the second contact 30 may be shaped like plates placed on a plane formed by second and third directions DR2 and DR3.

Referring to FIGS. 1 and 5 to 7, conductor resistance between the source 24 of transistor and the first interconnection 200 and conductor resistance between the drain 34 of transistor and the second interconnection 250 are each denoted by R. The conductor resistances generated when the first conductive plate 300 and the second conductive plate 350 are connected to the first interconnection 200 and the second interconnection 250, respectively, are each denoted by R1.

In FIG. 5, the transistor implemented by one of the gate lines 10 may be one of the transistors shown in FIG. 7. In addition, in FIG. 5, the transistor implemented by one gate line or the transistor implemented by multiple neighboring gate lines may be one of transistors shown in FIG. 7. For example, it is assumed that the semiconductor device according to example embodiments of the present invention is a power management IC (PMIC) because the PMIC generally includes a transistor having a source and a drain.

Conductor resistance between the source 24 of transistor and each of the first pads 400 may be reduced by providing the first conductive plate 300. In addition, conductor resistance between the drain 34 of transistor and each of the second pads 450 may be reduced by providing the second conductive plate 350. For example, if two resistors are interconnected in parallel, the resistance value of the parallel connected resistors becomes smaller than a value of each resistor. Therefore, conductor resistance values between the source 24 and the drain 34 of transistor and each of the first pads 400 and the second pads 450 are gradually reduced. If the resistance values of conductive wires between the source 24 and the drain 34 of transistor and each of the first pads 400 and the second pads 450 are gradually reduced, the power consumed by the conductive wires is reduced, thereby improving power transfer efficiency.

The first conductive plate 300 and the second conductive plate 350 are connected to the first interconnection 200 and the second interconnection 250, respectively, thereby reducing conductor resistance between a small unit transistor and a pad and further reducing conductor resistance between a large unit transistor constituted by a plurality of gate lines and a pad. Accordingly, the efficiency of the power transferred to the transistor can be increased.

An extended modification of the semiconductor device according to the first example embodiment of the present invention will be described with reference to FIGS. 1, 5 and 6.

In the first example embodiment of the present invention, one device region AR is illustrated, but example embodiments of the present invention are not limited thereto. Another device region adjacent to the device region AR may also be provided. For example, when a transistor formed on the device region AR is an n-type field effect transistor, a transistor formed on the other device region adjacent to the device region AR may be a p-type field effect transistor. The first conductive plate 300 may be electrically connected to the source 24 of the n-type field effect transistor, and the second conductive plate 350 may be electrically connected to the drain 34 of the n-type field effect transistor. The second conductive plate 350 may be electrically connected to a drain (not shown) of the p-type field effect transistor formed on the other device region adjacent to the device region AR. A source (not shown) of the p-type field effect transistor formed on the other device region adjacent to the device region AR may be electrically connected to a third conductive plate (not shown).

In other words, the respective drains of the p-type field effect transistor and the n-type field effect transistor formed in adjacent device regions may be electrically connected to one conductive plate, and the respective sources of the p-type field effect transistor and the n-type field effect transistor may be electrically connected to a separate conductive plate.

A semiconductor device according to a second example embodiment of the present invention will now be described with reference to FIGS. 8 to 11. Since the second example embodiment of the present invention is substantially the same as the first example embodiment, except for locations where first pads and second pads are formed, the same functional components as those of the previous example embodiment are denoted by the same reference numerals and detailed descriptions thereof will be briefly made or will not be made.

Figure 8:
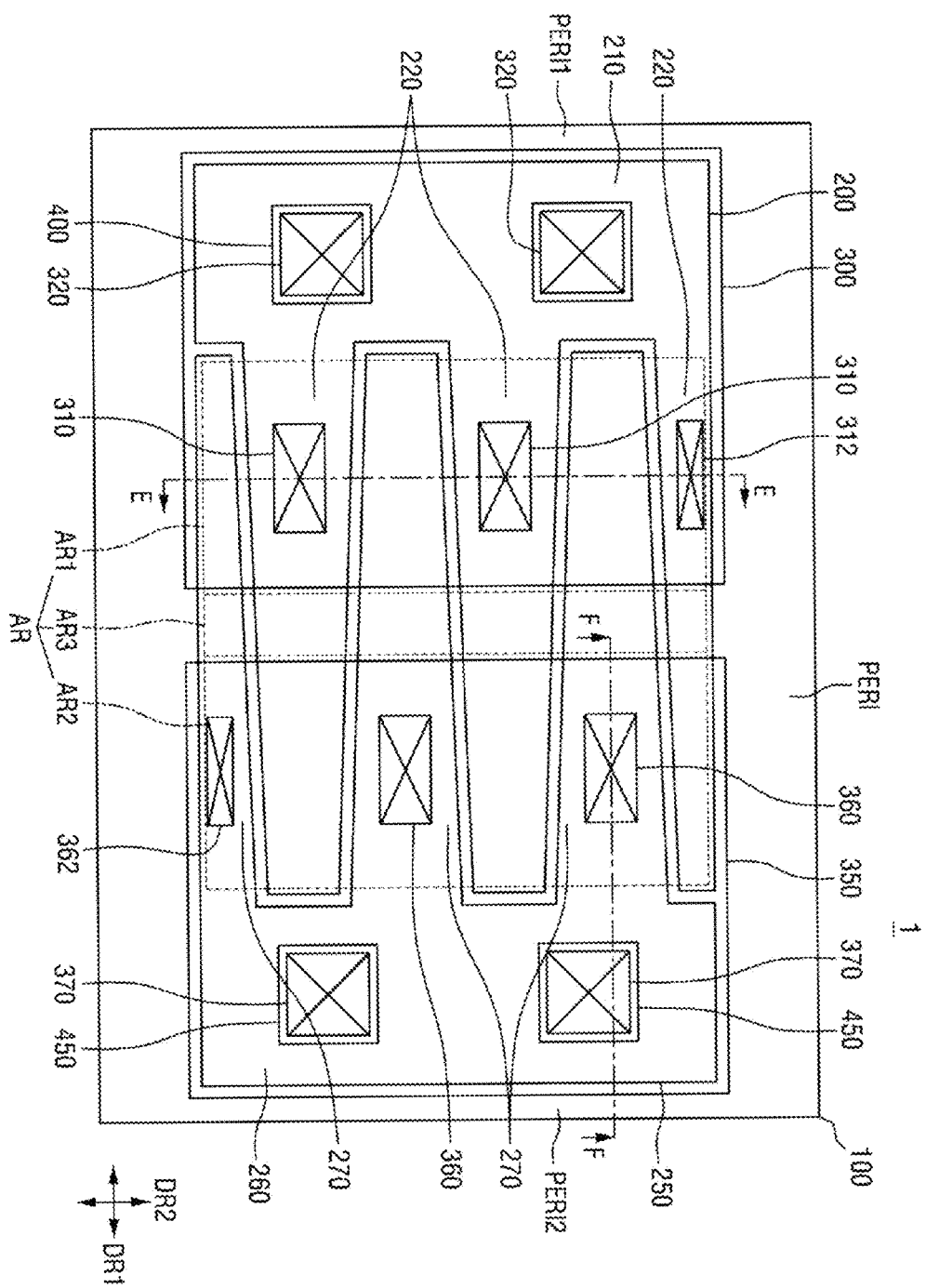
FIG. 8 is a plan view of a semiconductor device according to a second example embodiment of the present invention.
Figure 9:
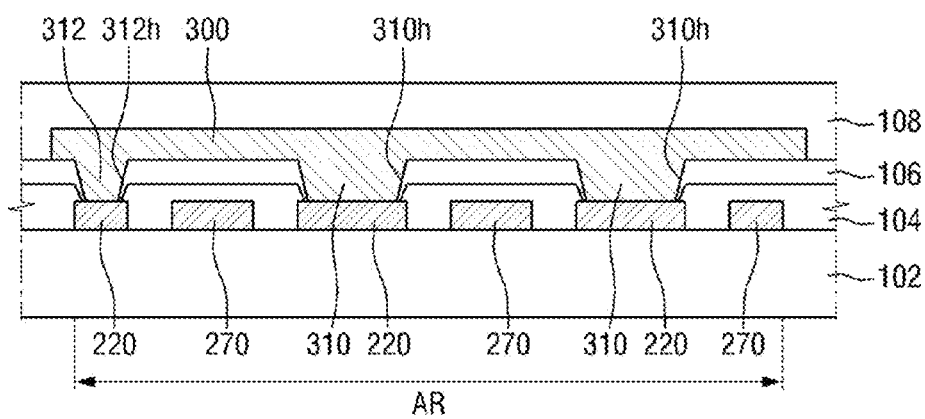
FIG. 9 is a cross-sectional view taken along the line EE of FIG. 8.
Figure 10:
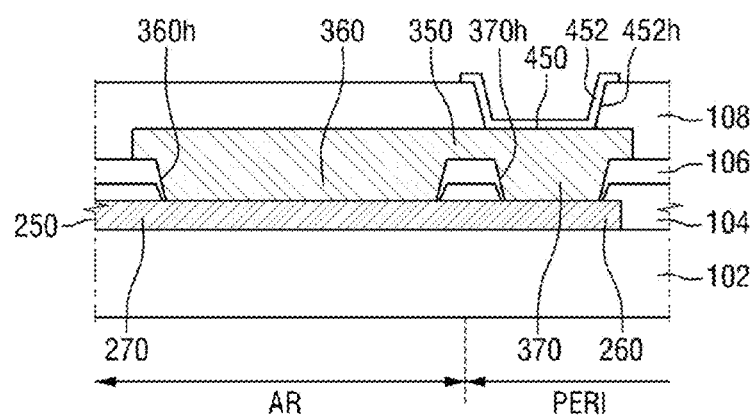
FIG. 10 is a cross-sectional view taken along the line FF of FIG. 8.
Figure 10:
Figure 11:
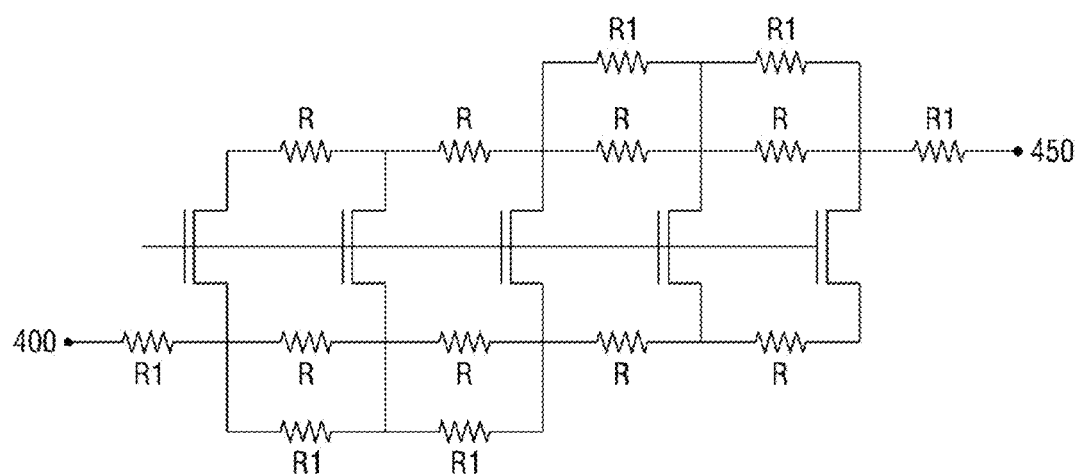
FIG. 11 is a schematic equivalent circuit view of the semiconductor device shown in FIG. 8.

FIG. 8 is a plan view of a semiconductor device according to a second example embodiment of the present invention, FIG. 9 is a cross-sectional view taken along the line EE of FIG. 8, FIG. 10 is a cross-sectional view taken along the line FF of FIG. 8 and FIG. 11 is a schematic equivalent circuit view of the semiconductor device shown in FIG. 8.

Referring to FIG. 8, the semiconductor device 2 may include a substrate 100, a first interconnection 200, a second interconnection 250, a first conductive plate 300, a second conductive plate 350, first vias 310 and 312, second vias 360 and 362, first pads 400 and the second pads 450. The semiconductor device 2 may further include one or more third vias 320 and one or more fourth vias 370.

The first vias 310 and 312 and the third vias 320 may be formed on the first interconnection 200, and the second vias 360 and 362 and fourth vias 370 may be formed on the second interconnection 250. The first vias 310 and 312 are formed on first conductive lines 220, and the third vias 320 are formed on first connection line 210. The second vias 360 and 362 are formed on a second conductive line 270, and the fourth vias 370 are formed on a second connection line 260. The first vias 310 and 312 and the second vias 360 and 362 are formed to overlap a device region AR, and the third vias 320 and fourth vias 370 are formed to overlap a peripheral region PERI. The third vias 320 are formed on a first peripheral portion PERI 1, and the fourth vias 370 are formed on a second peripheral portion PERI 2. The first vias 310 and 312 and the third vias 320 electrically connect the first interconnection 200 to the first conductive plate 300, and the second vias 360 and 362 and the fourth vias 370 electrically connect the second interconnection 250 to the second conductive plate 350.

The first pads 400 and the second pads 450 respectively included in the first conductive plate 300 and the second conductive plate 350 may be formed to overlap the peripheral region PERI. The first pads 400 may entirely overlap the first connection line 210 formed on the first peripheral portion PERI 1, and the second pads 450 may entirely overlap the second connection line 260 formed on the second peripheral portion PERI 2.

The third vias 320 and the fourth vias 370 may be formed at lower portions of the first pads 400 and the second pads 450, respectively. The first pads 400 may be formed to overlap the third vias 320, and the second pads 450 may be formed to overlap the fourth vias 370. For example, if the first pads 400 and the second pads 450 are larger than the third vias 320 and the fourth vias 370 in size, the third vias 320 may be completely overlapped by the first pads 400, and the fourth vias 370 may be completely overlapped by the second pads 450. For example, the third vias 320 and the first pads 400 may be formed to overlap each other, and the fourth vias 370 and the second pads 450 may be formed to overlap each other.

In the description of the semiconductor device 2 according to the second example embodiment of the present invention, the third vias 320 and the fourth vias 370 are formed on the peripheral region PERI, and the first pads 400 and the second pads 450 are formed to overlap the third vias 320 and the fourth vias 370, but example embodiments of the present invention are not limited thereto. For example, the third vias 320 and the fourth vias 370 may not be formed on the peripheral region PERI and the first pads 400 and the second pads 450 may be formed on the peripheral region PERI.

Referring to FIG. 9, one or more first vias 310 and 312 are formed on the device region AR. However, since the first pads 400 are not formed on the device region AR, the device region AR is entirely covered by the second passivation film 108.

Referring to FIG. 10, the second vias 360 and 362 formed on the device region AR are connected to the second conductive lines 270 of the second interconnection 250. The fourth vias 370 formed on the peripheral region PERI are connected to the second connection line 260 of the second interconnection 250. The second conductive plate 350 formed throughout the device region AR and the peripheral region PERI is directly connected to the second vias 360 and 362 and the fourth vias 370. For example, the second conductive plate 350, the second vias 360 and 362 and the fourth vias 370 may be formed at the same level.

The second pads 450 are formed on the peripheral region PERI. The fourth vias 370 may be positioned under the second pads 450. On the peripheral region PERI, the second pads 450 and the fourth vias 370 may be aligned in a third direction DR3.

The second pads 450 are electrically connected in parallel to the lower second vias 360 formed on the device region AR.

Referring to FIGS. 6, 8 and 11, the conductor resistance R1 may be connected in parallel to the source 24 and the drain 34 of transistor and a conductive wire between the first interconnection 200 and the second interconnection 250 by the first conductive plate 300 and the second conductive plate 350. Since the conductor resistance connected in parallel by the first conductive plate 300 and the second conductive plate 350 is reduced, resistance between the first pads 400 and the second pads 450 and between the source 24 and the drain 34 of transistor are reduced.

A semiconductor device according to a third example embodiment of the present invention will now be described with reference to FIGS. 12 and 13. Since the third example embodiment of the present invention is substantially the same as the first example embodiment, except for the number of vias formed on one conductive line, the same functional components as those of the previous example embodiment are denoted by the same reference numerals and detailed descriptions thereof will be briefly made or omitted.

Figure 12:
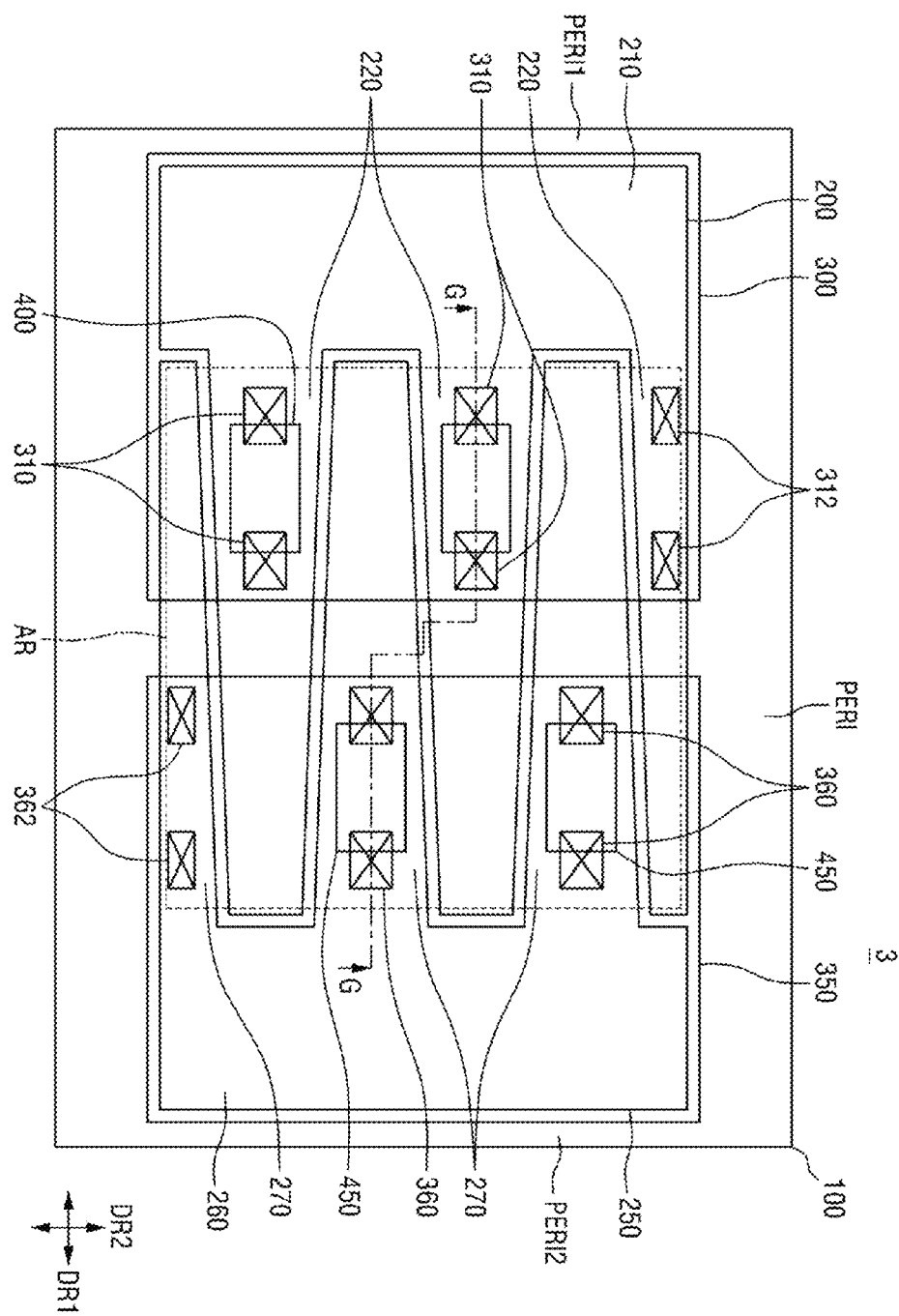
FIG. 12 is a plan view of a semiconductor device according to a third example embodiment of the present invention.
Figure 13:
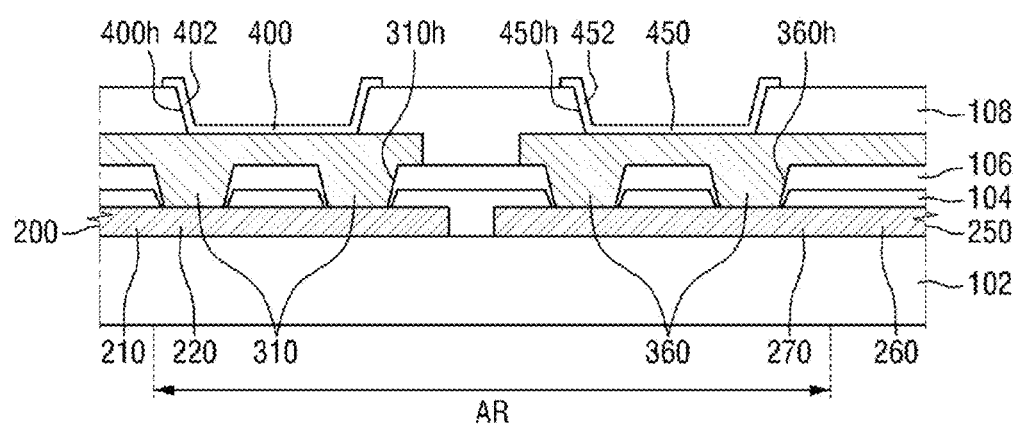
FIG. 13 is a cross-sectional view taken along the line GG of FIG. 12.

FIG. 12 is a plan view of a semiconductor device according to a third example embodiment of the present invention and FIG. 13 is a cross-sectional view taken along the line GG of FIG. 12.

Referring to FIG. 12, the semiconductor device 3 may include a substrate 100, a first interconnection 200, a second interconnection 250, a first conductive plate 300, a second conductive plate 350, first vias 310 and 312, second vias 360 and 362, first pads 400 and second pads 450.

A plurality of first vias 310 and 312 are formed on first conductive lines 220, and a plurality of second vias 360 and 362 are formed on second conductive lines 270, respectively. In other words, the plurality of first vias 310 and 312 and the plurality of second vias 360 and 362 are formed on one of the first conductive line 220 and one of the second conductive lines 270, respectively. The one of the first conductive lines 220 are connected to the first conductive plate 300 formed thereon by the plurality of first vias 310 and 312, and the one of the second conductive lines 270 are connected to the second conductive plate 350 formed thereon by the plurality of second vias 360 and 362.

The plurality of first vias 310 and 312 formed on one of the first conductive lines 220 may be aligned in a first direction DR1. Likewise, the plurality of second vias 360 and 362 formed on one of the second conductive line 270 may be aligned in the first direction DR1.

The plurality of first vias 310 and 312 are formed under the first conductive plate 300. The plurality of first vias 310 and 312 formed under the first conductive plate 300 may be formed in the first direction DR1 and in a second direction DR2. For example, the plurality of first vias 310 and 312 may be arranged in a lattice shape. Likewise, the plurality of second vias 360 and 362 formed under the second conductive plate 350 may be aligned in the first direction DR1 and in the second direction DR2, for example, in a lattice shape.

The first pads 400 included in the first conductive plate 300 may be formed to overlap the first conductive lines 220, and the second pads 450 included in the second conductive plate 350 may be formed to overlap the second conductive lines 270. The first pads 400 may be formed to overlap the plurality of first vias 310 formed thereunder. The first pads 400 may be formed to overlap at least some of the plurality of first vias 310. The second pads 450 may be formed to overlap the plurality of second vias 360 formed thereunder. The second pads 450 may be formed to overlap at least some of the plurality of second vias 360.

In the description of the semiconductor device according to the third example embodiment of the present invention, the first pads 400 and the second pads 450 are formed on the device region AR, but example embodiments of the present invention are not limited thereto. For example, the first pads 400 and the second pads 450 may be formed on the peripheral region PERI and may not overlap the first vias 310 and 312 and the second vias 360 and 362.

Referring to FIG. 13, a first interconnection 200 and a second interconnection 250 spaced apart from each other are formed on a circuit pattern region 102. The plurality of first vias 310 is formed on the same first conductive line 220, and the plurality of second vias 360 is formed on the same second conductive line 270. The plurality of first vias 310 and the plurality of second vias 360 are formed in the device region AR. The first pads 400 are formed in the first conductive plate 300 connected to the plurality of first vias 310, and the second pads 450 are formed in the second conductive plate 350 connected to the plurality of second vias 360. The first pads 400 and the second pads 450 may be formed to overlap the first vias 310 and the second vias 360, respectively.

A semiconductor device according to a fourth example embodiment of the present invention will now be described with reference to FIG. 14.

Figure 14:
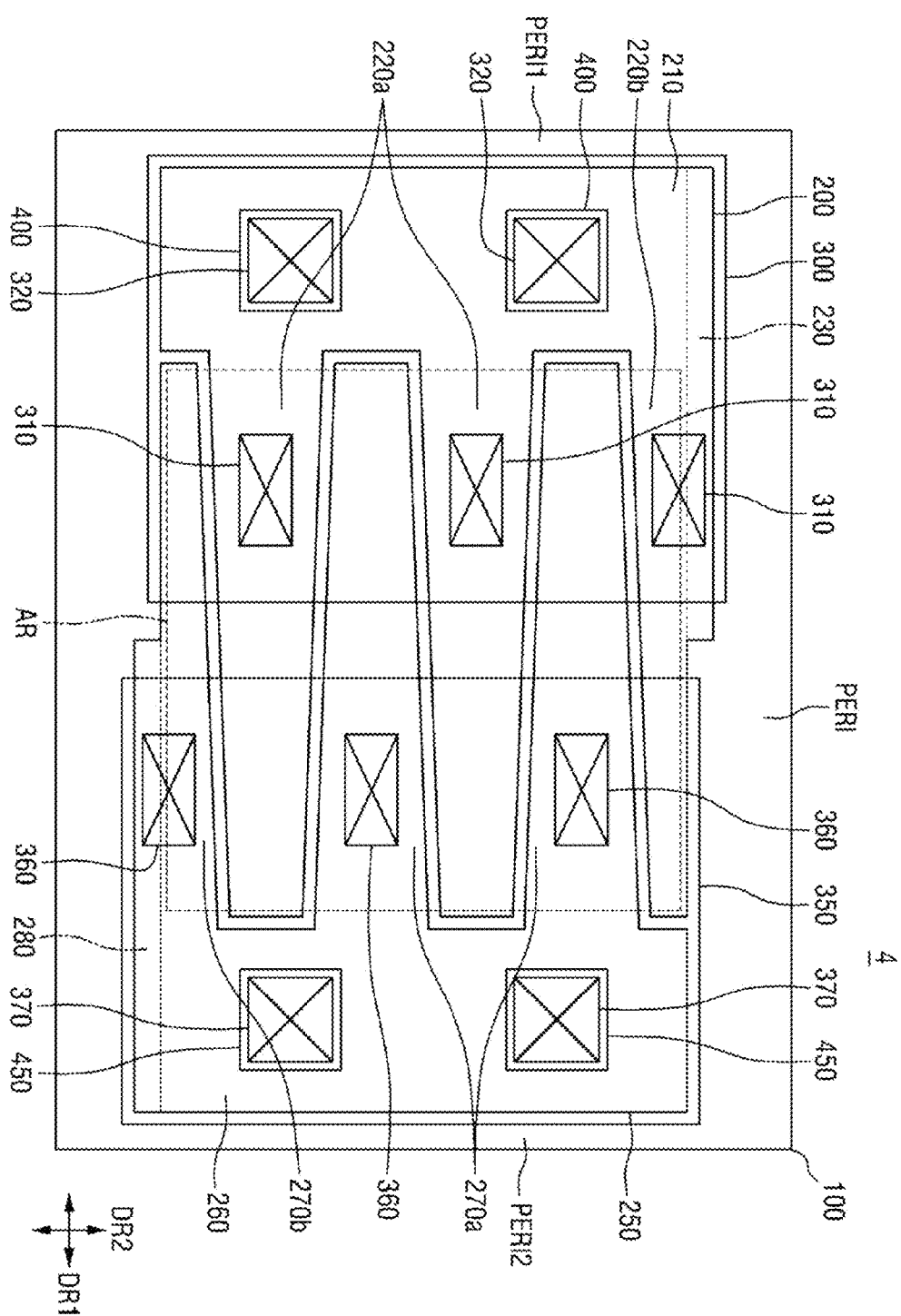
FIG. 14 is a plan view of a semiconductor device according to a fourth example embodiment of the present invention.

FIG. 14 is a plan view of a semiconductor device according to the fourth example embodiment of the present invention.

Referring to FIG. 14, the semiconductor device 4 includes a substrate 100, a first interconnection 200, a second interconnection 250, a first conductive plate 300, a second conductive plate 350, first vias 310 and 312, second vias 360 and 362, first pads 400 and second pads 450. The semiconductor device 4 may further include a third conductive line 230 and a fourth conductive line 280.

The first conductive lines 220 extend in a first direction DR1. One or more of the first conductive lines 220 extending in the first direction DR1 are arranged in a second direction DR2. Likewise, one or more of the second conductive lines 270 extending in the first direction DR1 are arranged in the second direction DR2. The first conductive lines 220 and the second conductive lines 270 are alternately arranged in the second direction DR2. The first conductive lines 220 may include a first conductive line 220a having a first width and a first conductive line 220b having a second width. In view of connecting parts of the first conductive lines 220 and the first connection line 210, the first width is greater than the second width. Likewise, the second conductive lines 270 may include a second conductive line 270a having a first width and a second conductive line 270b having a second width. In view of connecting parts of the second conductive lines 270 and the second connection line 260, the first width is greater than the second width.

The third conductive line 230 and the fourth conductive line 280 may be formed to extend in a first direction DR1, for example. The third conductive line 230 may contact the first conductive line 220b having the second width in the first direction DR1. The third conductive line 230 may be formed at the same level as the first conductive lines 220. The fourth conductive line 280 may contact the second conductive line 270b having the second width in the first direction DR1 and may be formed at the same level as the second conductive lines 270.

One side of the first interconnection 200 and the second interconnection 250 respectively including the third conductive line 230 and the fourth conductive line 280 may have stepped portions.

In the description of the fourth example embodiments of the present invention, the third conductive line 230 and the fourth conductive line 280 are independently formed, but example embodiments of the present invention are not limited thereto. For example, when only one of the first conductive lines 220 and the second conductive lines 270 include conductive lines having first and second widths, the third conductive line 230 or the fourth conductive line 280 may contact only the conductive lines having the first and second widths.

The first vias 310 formed on the first conductive line 220a having the first width and the first vias 310 formed on the first conductive line 220b and the third conductive line 230 having the second width may have substantially the same size. The second vias 360 formed on the second conductive lines 270 and the fourth conductive line 280 may have substantially the same size. The first vias 310 connecting the first conductive plate 300 and the first interconnection 200 are made to have the same size, the second vias 360 connecting the second conductive plate 350 and the second interconnection 250 are made to have the same size, thereby balancing the resistance between the first conductive plate 300 and the first interconnection 200 and the resistance between the second conductive plate 350 and the second interconnection 250.

In addition, a first lower interconnection (not shown) and a second lower interconnection (not shown) may be arranged directly below the first interconnection 200 and the second interconnection 250. The first lower interconnection and the second lower interconnection may be formed to extend in the second direction DR2, unlike the first conductive lines 220 and the second conductive lines 270. In the fourth example embodiment of the present invention, the first lower interconnection and the second lower interconnection may have the same width and may extend in the second direction DR2.

In FIG. 14, the first pads 400 and the second pads 450 are formed on the peripheral region PERI so as not to overlap the first vias 310 and the second vias 360, but example embodiments of the present invention are not limited thereto. For example, the first pads 400 and the second pads 450 may be formed on the first conductive lines 220 and the second conductive lines 270, respectively, while overlapping the first vias 310 and the second vias 360.

In FIGS. 1, 8, 12 and 14, the first interconnection 200 and the second interconnection 250 include the first connection line 210 and the second connection line 260, but example embodiments of the present invention are not limited thereto. For example, when the first pads 400 and the second pads 450 are formed on the peripheral region, the first interconnection 200 and the second interconnection 250 need to include the first connection line 210 and the second connection line 260, respectively. However, when the first pads 400 and the second pads 450 are formed on the first conductive lines 220 and the second conductive lines 270, respectively, the first interconnection 200 and the second interconnection 250 may not include the first connection line 210 and the second connection line 260, respectively. In other words, the first interconnection 200 and the second interconnection 250 are both electrically connected to the first conductive plate 300 and the second conductive plate 350 through the first vias 310 and the second vias 360, respectively. Therefore, electrical signals may be supplied to the first interconnection 200 and the second interconnection by the first pads 400 included in the first conductive plate 300 and the second pads 450 included in the second conductive plate 350.

Figure 15:
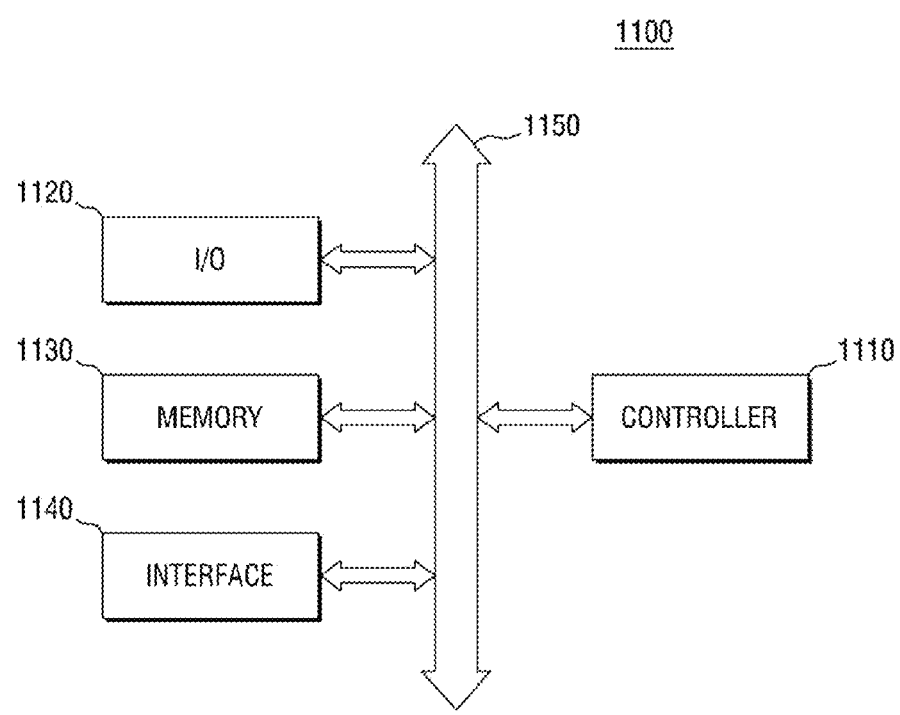
FIG. 15 is a block diagram of an electronic system incorporating a semiconductor device according to some example embodiments of the present invention.

FIG. 15 is a block diagram of an electronic system incorporating a semiconductor device according to some example embodiments of the present invention.

Referring to FIG. 15, the electronic system 1100 according to the present invention may include a controller 1110, an input/output (I/O) device 1120, a memory device 1130, an interface 1140 and a bus 1150. The controller 1110, the I/O device 1120, the memory device 1130 and/or the interface 1140 may be connected to each other through the bus 1150. The bus 1150 may correspond to a path through which data moves.

The controller 1110 may include at least one of a microprocessor, a digital signal processor, a microcontroller, and logic devices capable of performing similar functions to those performed by these devices. The I/O device 1120 may include a keypad, a keyboard, a display device, and the like. The memory device 1130 may store data and/or instructions in a non-transitory computer readable medium. The interface 1140 may transmit/receive data to/from a communication network. The interface 1140 may be wired or wireless. For example, the interface 1140 may include an antenna or a wired/wireless transceiver. Although not shown, the electronic system 1100 may be used as an operating memory for improving the operation of the controller 1110 and may further include a high-speed DRAM and/or SRAM. The fin-type transistor according to example embodiments of the present invention may be provided within the memory device 1130 or may be provided as a component of the controller 1110 or the I/O device 1120.

The electronic system 1100 may be applied to a personal digital assistant (PDA) a portable computer, a web tablet, a wireless phone, mobile phone, a digital music player, a memory card, and all electronic products capable of transmitting and/or receiving information in a wireless environment.

Figure 16:
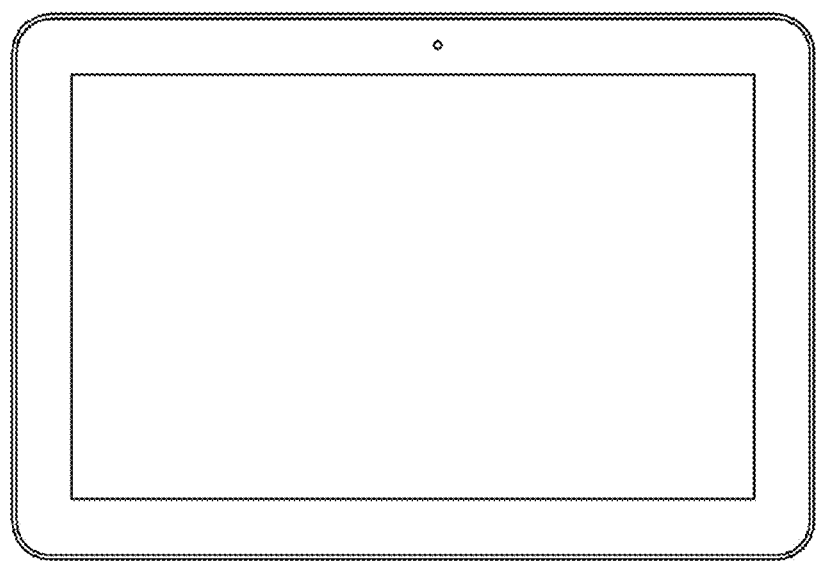
FIGS. 16 and 17 illustrate an example semiconductor system to which a semiconductor device according to some example embodiments of the present invention can be applied.
Figure 17:
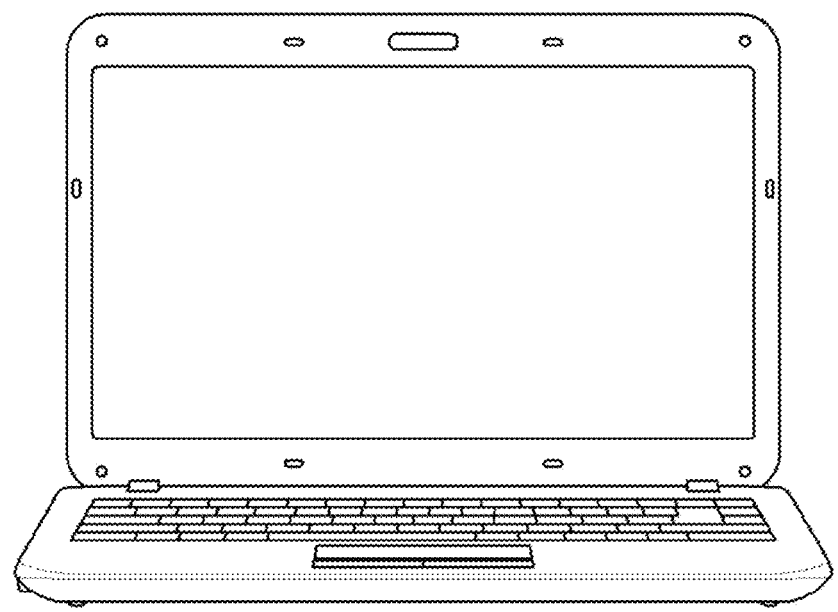

FIGS. 16 and 17 illustrate an example semiconductor system to which a semiconductor device according to some example embodiments of the present invention can be applied. Specifically, FIG. 16 illustrates a tablet PC and FIG. 17 illustrates a notebook computer. At least one of the semiconductor devices 1 to 4 according to some example embodiments of the present invention may be used in a tablet PC, a notebook computer, or the like. It is obvious to one skilled in the art that the semiconductor device according to some example embodiments of the present invention can be applied to other integrated circuit devices not illustrated herein.

While the present invention has been particularly shown and described with reference to some example embodiments thereof, it will be understood by those of ordinary skill in the art that various changes in form and details may be made therein without departing from the spirit and scope of the present invention as defined by the following claims. It is therefore desired that the present example embodiments be considered in all respects as illustrative and not restrictive, reference being made to the appended claims rather than the foregoing description to indicate the scope of the invention.

What is claimed is:

1. A semiconductor device comprising:
  a substrate including a device region and a peripheral region surrounding the device region;
  a first interconnection including one or more first conductive lines extending in a first direction on the substrate;
  a second interconnection including one or more second conductive lines extending in the first direction on the substrate, the second interconnection spaced apart from the first interconnection;
  a first conductive plate and a second conductive plate spaced apart from each other on the first and second interconnections, the first conductive plate corresponding to the first interconnection and the second conductive plate corresponding to the second interconnection;
  wherein the first conductive plate and the second conductive plate include a first pad and a second pad, respectively, and the first pad and the second pad are formed to overlap the peripheral region, and
  one or more first vias connecting the first conductive lines to the first conductive plate, the one or more first vias overlapping the device region and the first conductive lines;
  one or more second vias connecting the second conductive lines to the second conductive plate, the one or more second vias overlapping the device region and the second conductive lines, the one or more second vias arranged in a staggered, alternating configuration with the one or more first vias; and
  a third via and a fourth via overlapping the first pad and the second pad, respectively,
  wherein the third via connects the first conductive plate to the first interconnection, and the fourth via connects the second conductive plate to the second interconnection.

2. A semiconductor device comprising:
  a substrate including a device region and a peripheral region surrounding the device region;
  a first interconnection including one or more first conductive lines extending in a first direction on the substrate;
  a second interconnection including one or more second conductive lines extending in the first direction on the substrate, the second interconnection spaced apart from the first interconnection;
  a first conductive plate and a second conductive plate spaced apart from each other on the first and second interconnections, the first conductive plate corresponding to the first interconnection and the second conductive plate corresponding to the second interconnection;
  one or more first vias connecting the first conductive lines to the first conductive plate, the one or more first vias overlapping the device region and the first conductive lines;
  one or more second was connecting the second conductive lines to the second conductive plate, the one or more second vias overlapping the device region and the second conductive lines, the one or more second vias arranged in a staggered, alternating configuration with the one or more first vias; and
  a source and a drain formed in the device region,
  wherein the first interconnection is electrically connected to the source, and the second interconnection is electrically connected to the drain.

3. The semiconductor device of claim 2, further comprising:
  a gate line formed between the source and the drain;
  a first contact contacting the source; and
  a second contact contacting the drain,
  wherein the gate line is formed to extend lengthwise in the first direction or in a second direction different from the first direction, and the first contact and the second contact are formed to extend along the gate line.

4. A semiconductor device comprising:
  a substrate including a device region and a peripheral region;
  a gate line on the device region extending in one direction;
  a source and a drain formed on either side of the gate line;
  a first contact and a second contact formed in contact with the source and the drain, respectively, and extending along the gate line;

a first interconnection electrically connected to the first contact, the first interconnection aligned with the first contact and directly above the device region;

a second interconnection electrically connected to the second contact, the second interconnection aligned with the second contact and directly above the device region;

a first conductive plate overlapping a portion of the first interconnection and a portion of the second interconnection;

a second conductive plate overlapping a portion of the first interconnection and a portion of the second interconnection;

first vias connecting the first interconnection to the first conductive plate; and second vias connecting the second interconnection to the second conductive plate.

5. The semiconductor device of claim 4, wherein the first conductive plate includes a first pad on the first interconnection, and the first pad is on the device region.

6. The semiconductor device of claim 4, wherein the first conductive plate includes a first pad on the first interconnection, and the first pad is on the peripheral region.

* * * * *